United States Patent
Yang et al.

(10) Patent No.: US 9,875,967 B2
(45) Date of Patent: Jan. 23, 2018

(54) INTERCONNECT STRUCTURE WITH AIR-GAPS

(71) Applicant: Taiwan Semiconductor Manufacturing Co., Ltd., Hsin-Chu (TW)

(72) Inventors: Tai-I Yang, Hsinchu (TW); Cheng-Chi Chuang, New Taipei (TW); Yung-Chih Wang, Taoyuan (TW); Tien-Lu Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/464,759

(22) Filed: Mar. 21, 2017

(65) Prior Publication Data

US 2017/0194259 A1    Jul. 6, 2017

Related U.S. Application Data

(60) Continuation of application No. 15/170,059, filed on Jun. 1, 2016, now Pat. No. 9,633,897, which is a
(Continued)

(51) Int. Cl.
*H01L 23/528* (2006.01)
*H01L 23/532* (2006.01)
*H01L 21/768* (2006.01)

(52) U.S. Cl.
CPC ...... *H01L 23/5283* (2013.01); *H01L 21/7682* (2013.01); *H01L 21/76804* (2013.01); *H01L 21/76807* (2013.01); *H01L 21/76831* (2013.01); *H01L 21/76834* (2013.01); *H01L 21/76843* (2013.01); *H01L 21/76879* (2013.01); *H01L 23/53238* (2013.01); *H01L 23/53295* (2013.01)

(58) Field of Classification Search
CPC ............. H01L 21/7682; H01L 23/5222; H01L 23/53295; H01L 23/53238; H01L 21/76885; H01L 21/76807; H01L 2221/1031
USPC ....... 438/618, 619, 421, 411, 622, 637, 638; 257/E21.581, E21.573, E23.145
See application file for complete search history.

(56) References Cited

U.S. PATENT DOCUMENTS 6,200,900 B1    3/2001  Kitch
7,256,127 B2    8/2007  Gallagher et al.
(Continued)

OTHER PUBLICATIONS

Z. Gabric, et al.; "Air Gap Technology by Selective Ozone/TEOS Deposition"; 2004 IEEE; p. 151-153.
(Continued)

*Primary Examiner* — Jonathan Han
(74) *Attorney, Agent, or Firm* — Eschweiler & Potashnik, LLC

(57) ABSTRACT

The present disclosure relates to an interconnect structure. In some embodiments, the interconnect structure has a first conductive body arranged within a first dielectric layer over a substrate. A first air-gap separates sidewalls of the first conductive body from the first dielectric layer. A barrier layer is arranged on sidewalls of the first conductive body at a location between the first conductive body and the first air-gap. The first air-gap is defined by a sidewall of the barrier layer and an opposing sidewall of the first dielectric layer.

20 Claims, 13 Drawing Sheets

Related U.S. Application Data division of application No. 14/135,785, filed on Dec. 20, 2013, now Pat. No. 9,390,965.

(56) References Cited

U.S. PATENT DOCUMENTS

| | | | |
|---|---|---|---|
| 7,871,923 B2 | 1/2011 | Liu et al. | |
| 8,241,990 B2 | 8/2012 | Chen | |
| 2002/0098673 A1 | 7/2002 | Yeh et al. | |
| 2005/0230836 A1 | 10/2005 | Clarke et al. | |
| 2006/0073695 A1 | 4/2006 | Filippi et al. | |
| 2007/0178713 A1 | 8/2007 | Jeng | |
| 2008/0174017 A1* | 7/2008 | Yang | H01L 21/7682 257/751 |
| 2008/0182405 A1* | 7/2008 | Liu | H01L 21/76807 438/623 |
| 2008/0185722 A1 | 8/2008 | Liu et al. | |
| 2009/0072409 A1* | 3/2009 | Nitta | H01L 21/76808 257/774 |
| 2009/0121356 A1 | 5/2009 | Nakagawa | |
| 2010/0001409 A1 | 1/2010 | Humbert et al. | |
| 2010/0133648 A1 | 6/2010 | Seidel et al. | |
| 2011/0198757 A1 | 8/2011 | Su et al. | |

OTHER PUBLICATIONS

Stich, A., et al., "Integration of air gaps based on selective ozone/TEOS deposition into a multi layer metallization scheme," 2006 International Interconnect Technology Conference, p. 134-136, Jun. 5-7, 2006.

Notice of Allowance dated Mar. 16, 2016 for U.S. Appl. No. 14/135,785.

Non-Final Office Action dated Aug. 9, 2016 for U.S. Appl. No. 15/170,059.

Notice of Allowance dated Dec. 22, 2016 for U.S. Appl. No. 15/170,059.

* cited by examiner

INTERCONNECT STRUCTURE WITH AIR-GAPS

REFERENCE TO RELATED APPLICATION

This Application is a Continuation of U.S. application Ser. No. 15/170,059 filed on Jun. 1, 2016, which is a Divisional of U.S. application Ser. No. 14/135,785 filed on Dec. 20, 2013 (now U.S. Pat. No. 9,390,965 issued on Jul. 12, 2016). The contents of both applications listed above are hereby incorporated by reference in their entirety.

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photo-lithography, mask alignment, isolation and device performance among other factors. As the distance between any two adjacent conductive features decreases, the resulting capacitance increases, which will increase power consumption and time delay.

To reduce parasitic capacitance and correspondingly improve device performance, IC designers utilize low-k dielectrics. One kind of low-k dielectric is produced by doping silicon oxide ($SiO_2$) with impurities. For example, while pure $SiO_2$ has a dielectric constant of 3.9, fluorinated silica glass in which $SiO_2$ has been doped with fluorine has a dielectric constant of 3.5. Further, $SiO_2$ which has been doped with carbon can have a dielectric constant that is further lowered to about 3.0. Another kind of low-k material is produced by creating large voids or pores in a dielectric. Voids can have a dielectric constant of nearly 1, thereby reducing the dielectric constant of the porous material by increasing the porosity of the material. Large pores, also referred to as air-gaps, can provide an extremely low-k dielectric between the two conductive features.

DETAILED DESCRIPTION

Figure 1A:
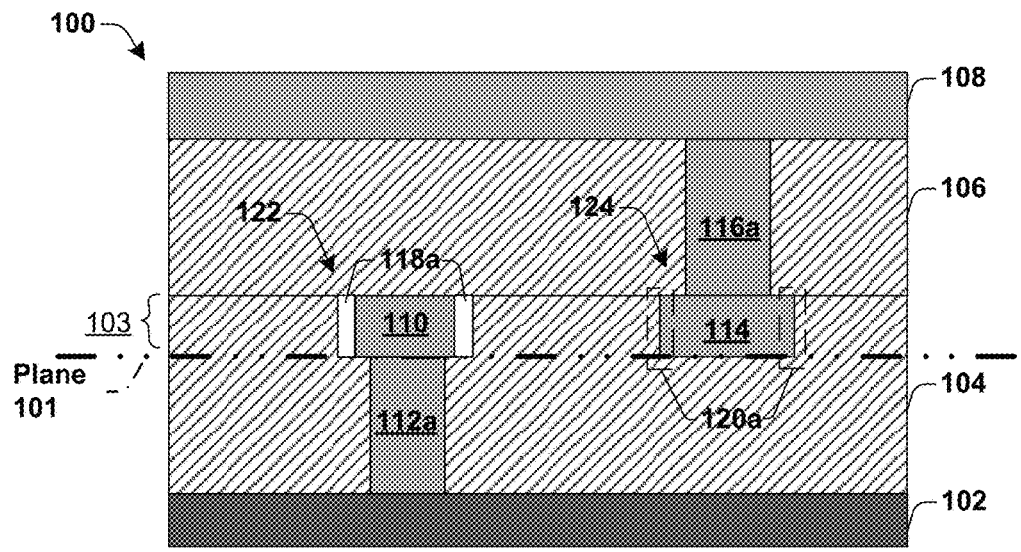
FIG. 1A illustrates a cross-sectional view of some embodiments of an interconnect structure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

The present disclosure relates to air-gap forming techniques. Usage of air-gaps can reduce overall k-value, reduce capacitance, and improve RC delay in Back-end of Line (BEOL) structures. By forming air-gaps on sidewalls of conductive bodies, such as metal lines, a k-value of the dielectric material is reduced. In some embodiments, a selective portion of dielectric material is etched away to form metal lines trenches. Prior to filling these trenches with a conductive material, sacrificial spacers are formed on the sidewalls of the trenches. Then a portion of the sacrificial spacers is removed including some portions that abut to sidewalls of up landing pads in the metal lines to which vias are coupled upwardly. Sacrificial spacers locate at desired air-gap positions may be kept until the conductive material is filled. In such ways, there will be no air-gap abutting the sidewalls of the up landing pads, while air-gaps will be present on sidewalls for down landing pads. These techniques allow better via alignment while at the same time providing lower k-values. Damage and contamination to the dielectric material between the metal lines introduced by the followed etching is also reduced.

FIG. 1a illustrates a cross-sectional view of some embodiments of an interconnect structure 100. A first low-k dielectric layer 104 is formed over a substrate 102. A first conductive layer 103 in the first low-k dielectric layer comprises a down landing pad 110 and an up landing pad 114 that are arranged in a common horizontal plane 101. The down landing pad 110 has an air-gap 118a between its sidewalls and the first low-k dielectric layer 104. Sidewalls of the up landing pad 114 are adjacent to the first low-k dielectric layer 104 without an air-gap being formed, shown by region 120a. In some embodiments, the down landing pad 110 or the up landing pad 114 can be connected to a third conductive layer (not shown) under the first low-k dielectric layer 104 or a device (not shown) disposed on the substrate 102.

Still in FIG. 1a, a second low-k dielectric layer 106 is disposed over the first low-k dielectric layer 104. A first via 116a is disposed in the second low-k dielectric layer 106 and vertically aligned to the up landing pad 114 in the first low-k dielectric layer 104. The first via 116a is disposed on the up landing pad 114 and connected to a second conductive layer 108 over the second low-k dielectric layer 106. The first low-k dielectric layer 104 and the second low-k dielectric layer 106 can be porous material with some pores or voids in it.

Figure 1B:
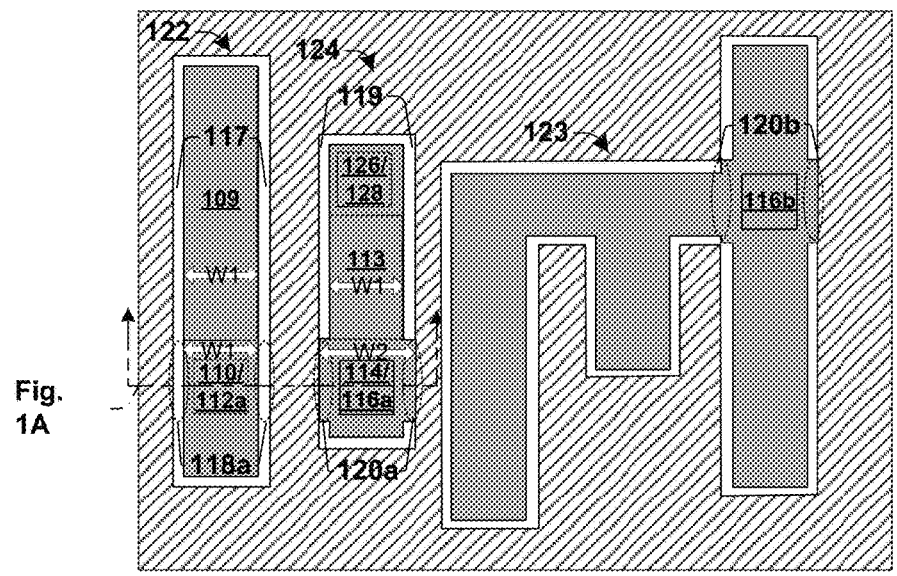
FIG. 1B illustrates a top-sectional view of some embodiments of an interconnect structure.

FIG. 1b illustrates a top-sectional view of some embodiments of an interconnect structure including an example top-sectional view of the interconnect structure of FIG. 1a. A first metal line 124 of the first conductive layer is disposed in the first low-k dielectric layer 104. The first metal line 124 comprises a first conductive body 113 and the up landing pad 114, which both lie in common horizontal plane 101. The first conductive body has a first width W1 and the up landing pad 114 has a second width W2 that is larger than the first width W1. The first via 116a in the second low-k dielectric layer 106 is disposed on the up landing pad 114. An air-gap 119 is adjacent to sidewalls of the first conductive body 113. In some embodiments, the up landing pad 114 has outer sidewalls that abut the first low-k dielectric layer 104. No air-gap is formed between the outer sidewalls of the landing pad 114 and the first low-k dielectric layer 104. The first metal line 124 can further comprise a down landing pad 126 from which another via 128 descends. The down landing pad 126 has the same width, W1 as the first conductive body 113 and has air-gaps 119 adjacent to its outer sidewalls.

In some other embodiments, a second metal line 122 is arranged in the first low-k dielectric layer 104 in the common horizontal plane 101 with the first metal line 124. The second metal line 122 comprises a second conductive body 109 and a down landing pad 110, which have the same width W1. A second via 112a is disposed under the down landing pad 110 and is electrically coupled to a lower surface of the down landing pad 110. An air-gap 118a is adjacent to sidewalls of the down landing pad 110 and extends continuously along sidewalls of the second conductive body 109.

Figure 2:
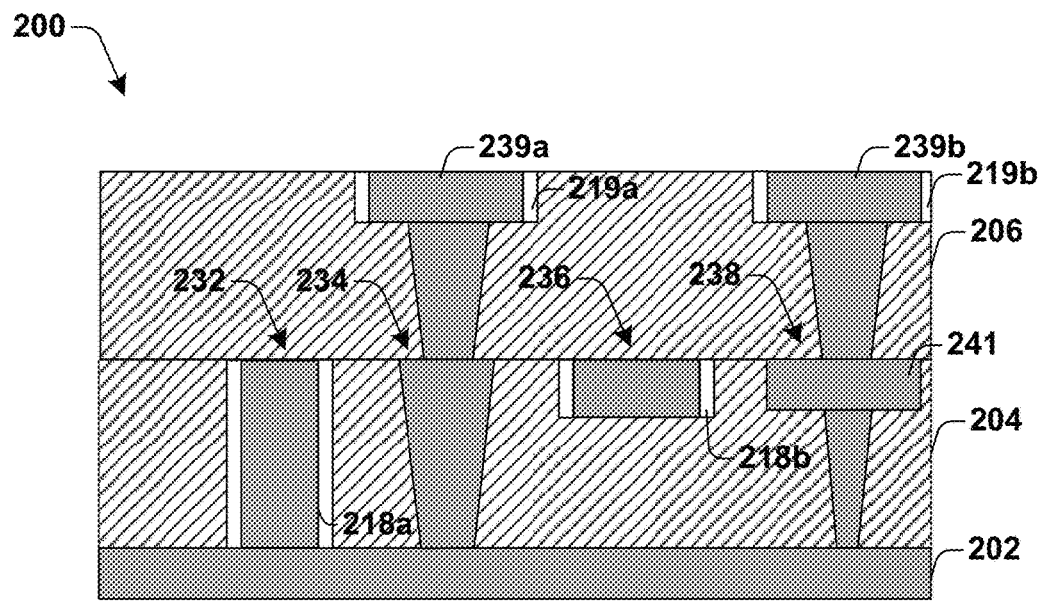
FIG. 2 illustrates a cross-sectional view of some alternative embodiments of an interconnect structure of a semiconductor device.

FIG. 2 illustrates a cross-sectional view of some alternative embodiments of an interconnect structures, for example, 232, 234, 236 or 238. Connection structures can be dual damascene structures (e.g., 238). A sidewall of connection structures can be perpendicular (232) or tilted (234), relative to a surface of the substrate. Air-gaps, such as 219a and 219b, can be disposed about sidewalls of down landing pads, such as 239a, 239b, respectively. For up landing pads, such as 241, the sidewalls of the up landing pad 241 abut the surrounding low-k dielectric layer 204.

Figure 3:
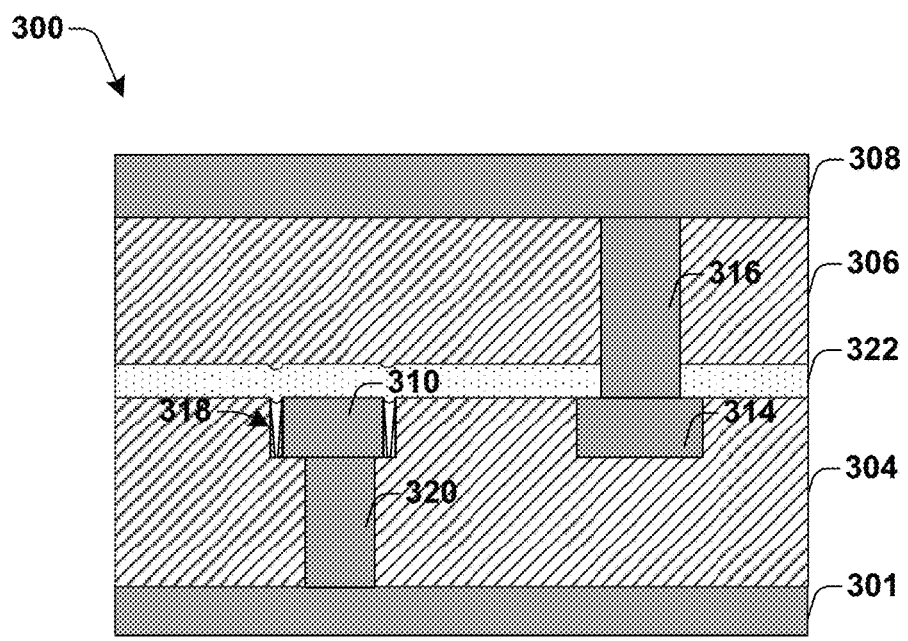
FIG. 3 illustrates a cross-sectional view of some alternative embodiments of an interconnect structure.

FIG. 3 illustrates a cross-sectional view of some alternative embodiments of an interconnect structure. First and second low-k dielectric layers 304, 306 are formed between first and second conductive layers 301, 308. The first conductive layer 301 can comprise a conductive device region, such as a source/drain region in a substrate; or can comprise a metal interconnect layer or some other conductive region. The second conductive layer 308 typically comprises a metal interconnect layer. A down landing pad 310 and an up landing pad 314 are formed in the first low-k dielectric layer 304. A first via 316, which is vertically aligned to the up landing pad 314, is formed in a second low-k dielectric layer 306 and electrically couples the up landing pad 314 to the second conductive layer 308. The down landing pad 310 is electrically coupled to the first conductive layer 301 through a second via 320. An air-gap 318 is adjacent to sidewalls of the down landing pad 310. In some embodiments, a third dielectric layer 322 can be formed between the first low-k dielectric layer 304 and the second low-k dielectric layer 306. This third dielectric layer 322, can be formed, for example by chemical vapor deposition, and can have a different lattice structure from that of a low-k dielectric layer. This third dielectric layer 322 can provide higher structural integrity to support the low-k dielectric layer. At least a significant portion of the air-gap 318 is left after formation of the third dielectric layer 322. No significant air-gap is adjacent to sidewalls of the up landing pad 314 above which the first via 316 is connected to the second conductive layer 308.

If we compare FIG. 1 to FIG. 3 (direct in FIG. 1), in some embodiments, the second low-k dielectric layer can be disposed directly on the first low-k dielectric layer. By avoiding a third dielectric layer with a relative high dielectric constant between the first low-k dielectric layer and the second low-k dielectric layer, a lower overall effective dielectric constant can be achieved.

Figure 4:
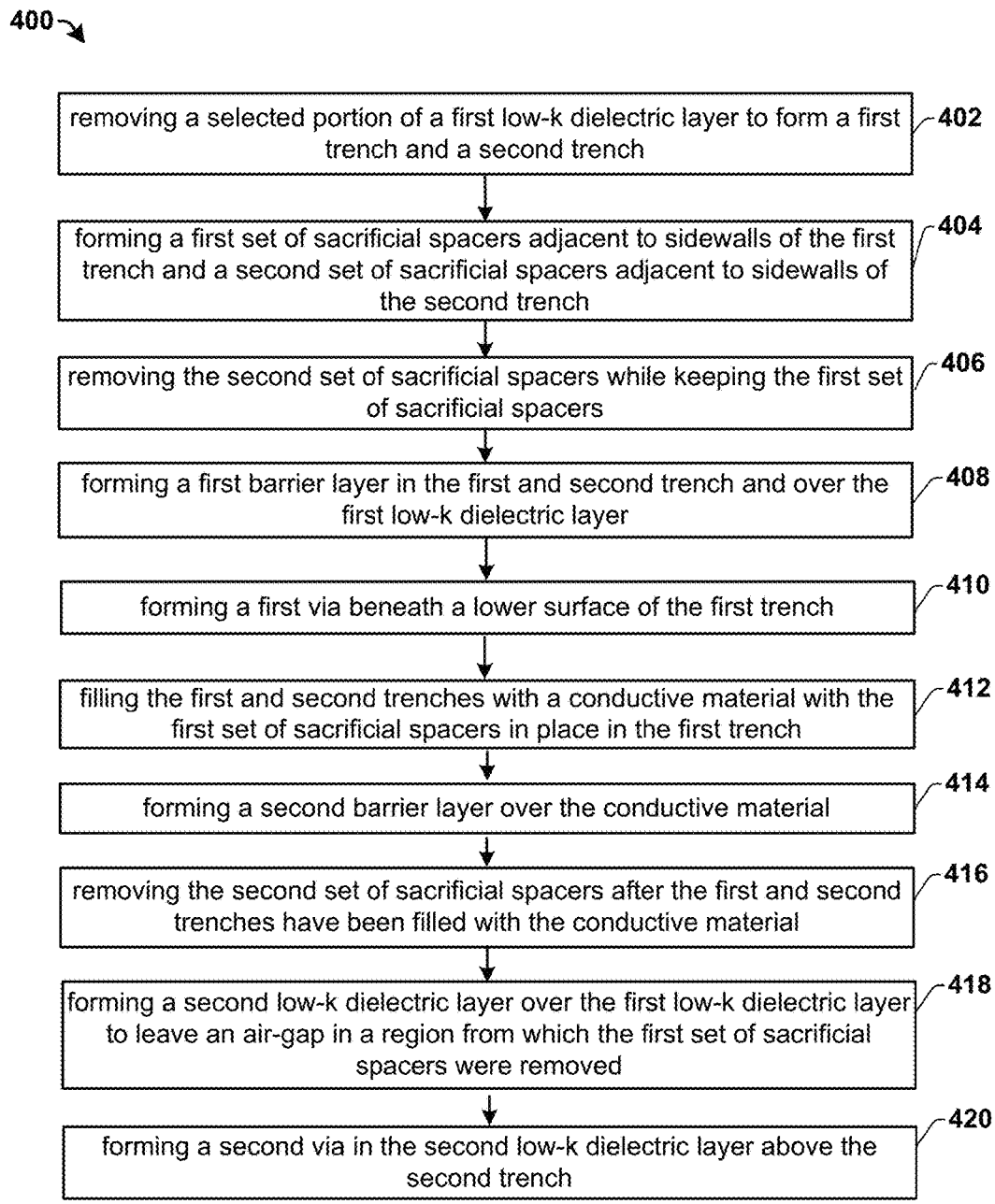
FIG. 4 illustrates a flow diagram of some embodiments of a method of forming an air-gap for interconnect structures.

FIG. 4 illustrates a flow diagram of some embodiments of a method of forming an air-gap for interconnect structures.

While disclosed methods (e.g., methods 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a selected portion of a first low-k dielectric layer is removed to form a first trench and a second trench. A photolithography process can be applied for the opening patterning purpose.

At 404, a first set of sacrificial spacers adjacent to sidewalls of the first trench and a second set of sacrificial spacers adjacent to sidewalls of the second trench are formed. In some embodiments, a sacrificial layer, for example, comprising Titanium Nitride (TiN) or Titanium Oxide (TiO), is firstly formed on a top surface of the first low-k dielectric layer and the sidewalls of the trenches. Then a portion of the sacrificial layer on a horizontal surface of the first low-k dielectric layer is etched away to form the sacrificial spacers.

At 406, the second set of sacrificial spacers is removed while the first set of sacrificial spacers is kept in place to aid in air-gap formation. There would be no air-gap formed on the second sidewall of the second trench in the following process. In some embodiments, a mask is applied to keep the second trench with sacrificial spacers open for etching. An opening of the mask is wide relative to a horizontal dimension of the expecting air-gap, thus alignment requirements are decreased.

At 408, a first barrier layer, for example, comprising Tantalum (Ta), Tantalum Nitride (TaN), Cobalt (Co) or their alloy is formed over the opening and the first low-k dielectric layer. The first barrier layer could be bilayer or multilayer formed by more than one material.

At 410, a first via under the first trench is formed connecting to a first device or a first conductive layer under the first low-k dielectric layer. The first via is connected to a first device or a first conductive layer under the first low-k dielectric layer.

At 412, the first and second trenches are filled with a conductive material, for example copper, with the first set of sacrificial spacers in place in the first trench. A Chemical-Mechanical Polishing (CMP) process can be applied to smooth surfaces and remove a top portion of the conductive material that is not needed. Thus, a metal line comprising a copper core and a barrier layer abutting outer lateral sidewalls of the core is formed.

At 414, a second barrier layer, for example, comprising Cobalt (Co) cap and a silicide material are formed on an exposed surface of the conductive material. The second barrier layer can act as an etch stop layer (ESL).

At 416, the second set of sacrificial spacers is removed after the first and second trenches have been filled with the conductive material. An opening for the air-gap is opened at this step.

At 418, a second low-k dielectric layer is formed over the first low-k dielectric layer to leave an air-gap in an region from which the first set of sacrificial spacers were removed. It can be formed by spin-on process directly on the first low-k dielectric layer and the air-gap is formed. In some alternative embodiments, the second low-k dielectric layer can be deposited after depositing another dielectric layer with relative high k value by non-conformal CVD process.

At 420, a second via is formed in the second low-k dielectric layer above the second trench connecting to a second device or a second conductive layer above the second low-k dielectric layer. Since there is no air-gap on the sidewall of the second trench, there will be less damage to the first low-k dielectric layer during a process to open the second low-k dielectric layer downward to the second trench in the first low-k dielectric layer.

FIGS. 5a-14b illustrate some embodiments of cross-sectional views and corresponding top-sectional views of a semiconductor substrate showing a method of forming an air-gap for interconnect structures. Although FIGS. 5a-14b are described in relation to method 400, it will be appreciated that the structures disclosed in FIGS. 5a-14b are not limited to such a method.

Figure 5A:
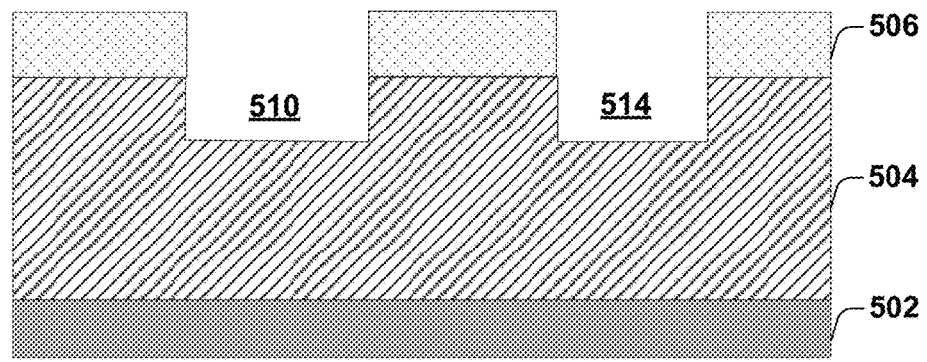
FIGS. 5A-14B illustrate some embodiments of cross-sectional views and corresponding top-sectional views of a semiconductor substrate showing a method of forming an air-gap for interconnect structures.
Figure 5B:
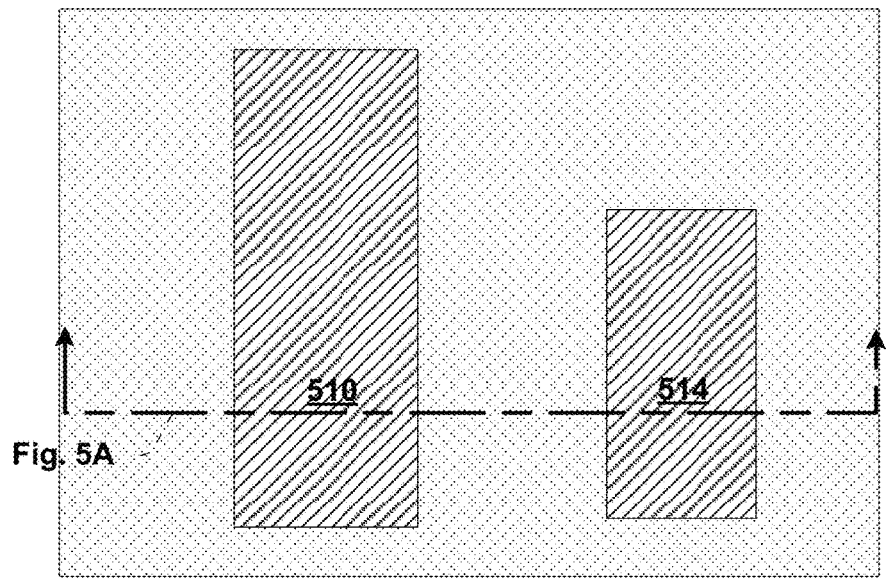

As shown in FIG. 5a, a selected portion of a first low-k dielectric layer 504 is removed to form a first trench 510 and a second trench 514. A mask layer 506 is applied for selective opening. FIG. 5b shows a top-view of the semiconductor substrate.

Figure 6A:
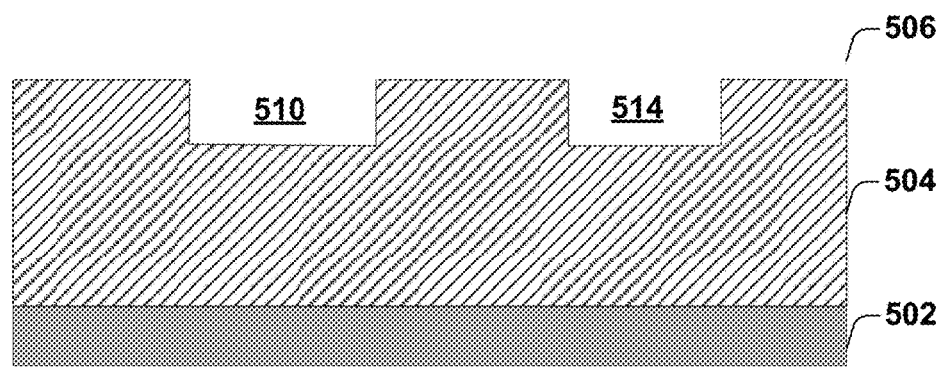
Figure 6B:
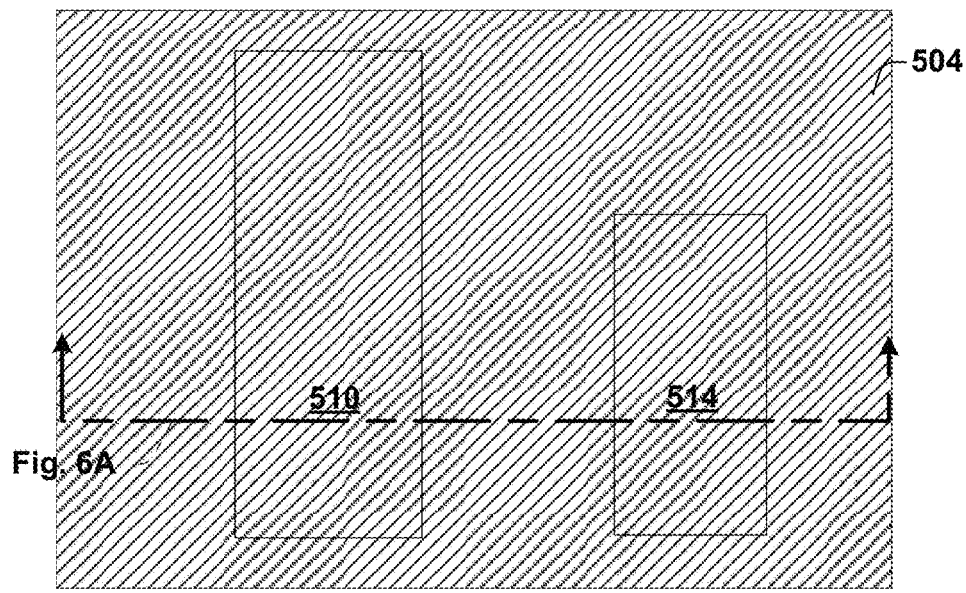

As shown in FIGS. 6a-6b, the mask layer 506 is removed.

Figure 7A:
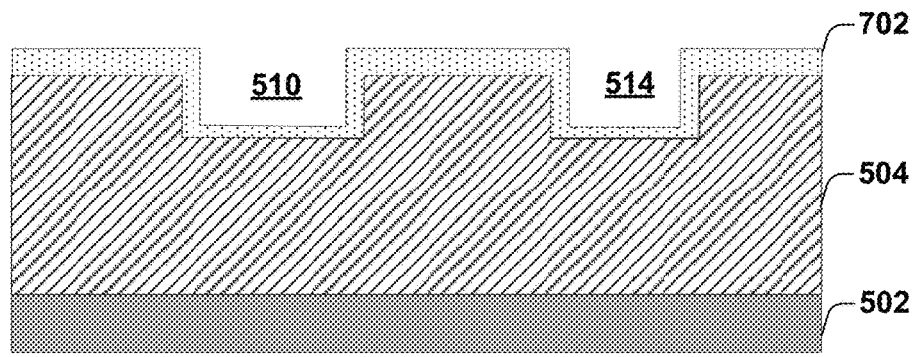
Figure 7B:
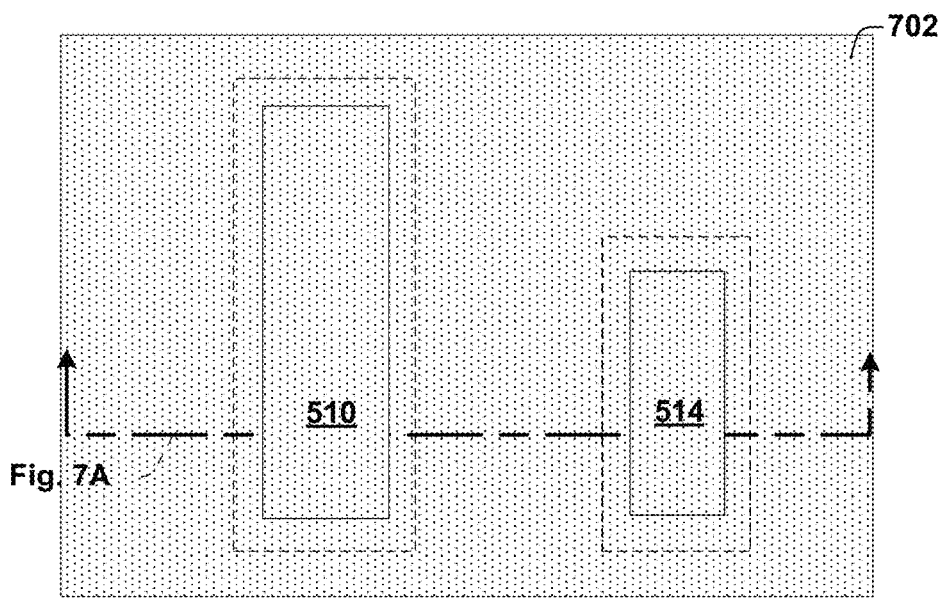

As shown in FIGS. 7a-7b, a sacrificial layer 702 for example, TiN or TiO, with a thickness of from about 100 Å to about 500 Å is formed on the first low-k dielectric layer 504.

Figure 8A:
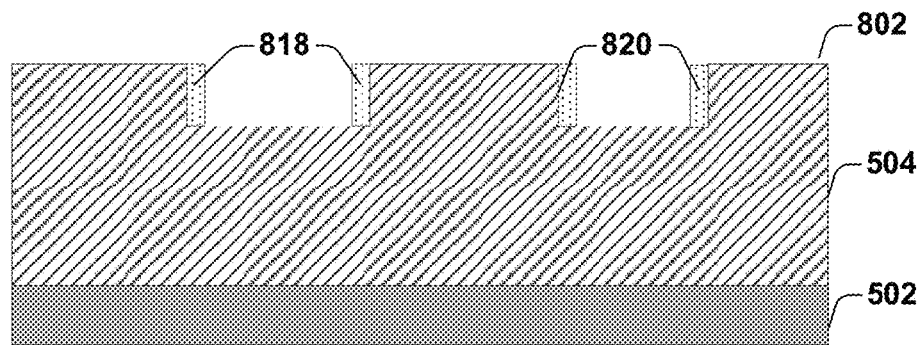
Figure 8B:
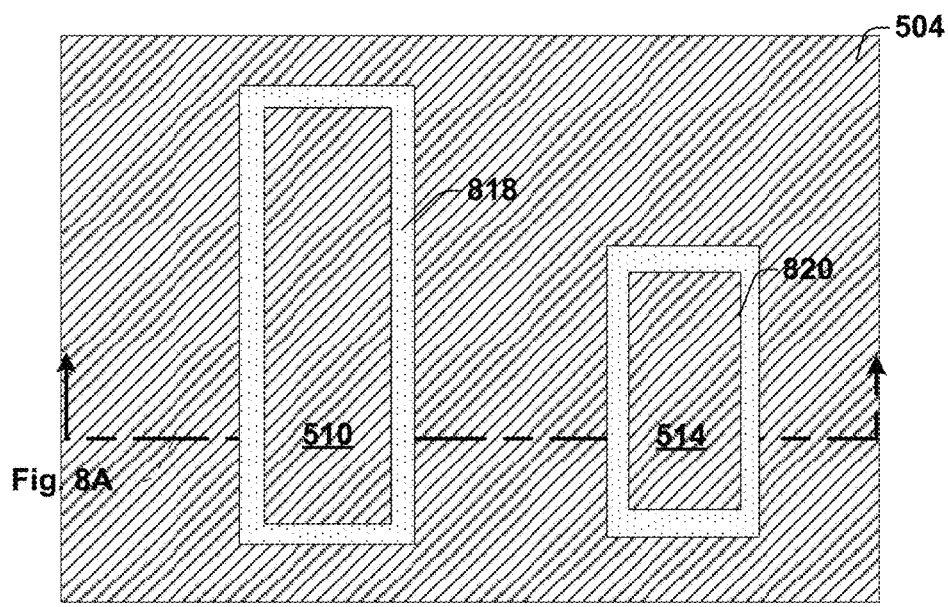

As shown in FIGS. 8a-8b, a portion of the sacrificial layer on a horizontal surface 802 of the first low-k dielectric layer 504 is etched away to form a first set of sacrificial spacers 818 and a second set of sacrificial spacers 820.

Figure 9A:
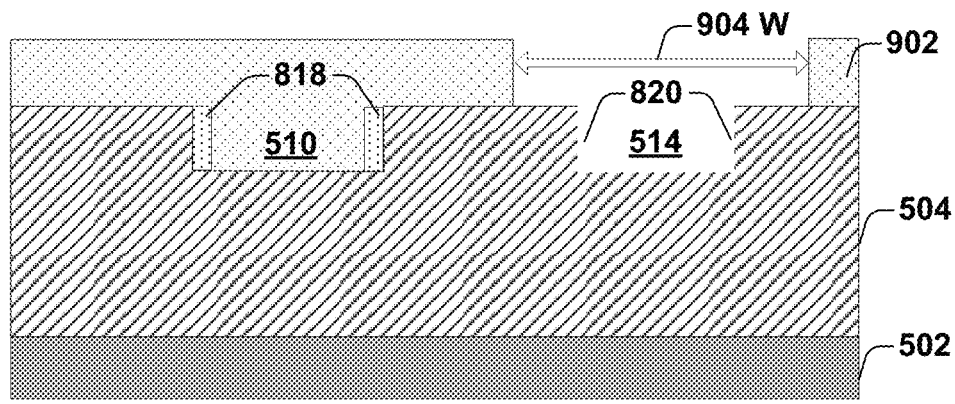
Figure 9B:
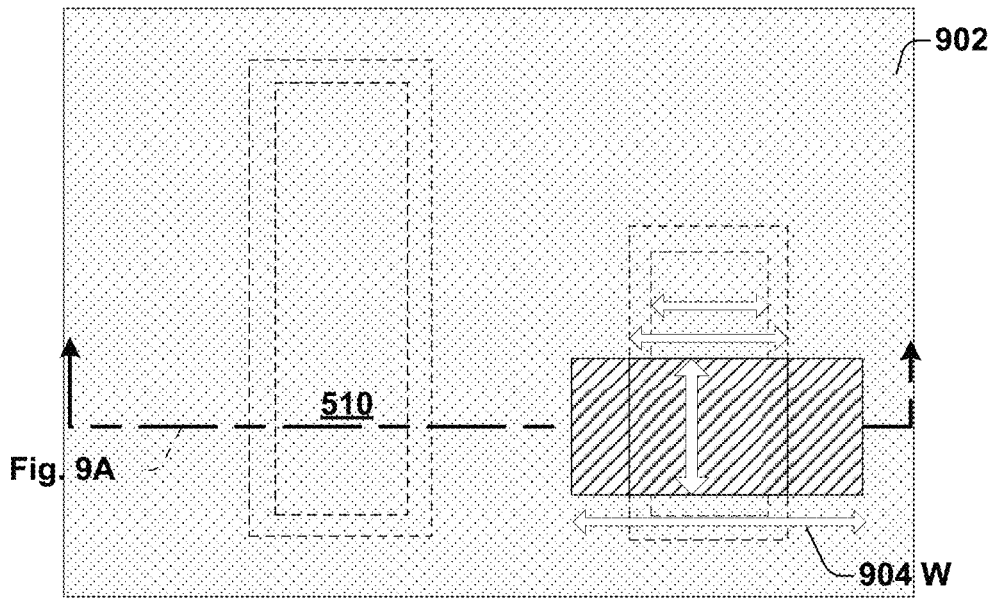

As shown in FIGS. 9a-9b, the second set of the sacrificial spacers 820 on sidewalls of the second trench 514 is removed with a mask 902 in place. In some embodiments, a wet etching process comprising a wet etchant may be applied within a processing chamber held at a temperature of between approximately 30° C. and approximately 70° C. For example, the wet etchant may comprise Hydrogen peroxide ($H_2O_2$) or Sulfuric Acid ($H_2SO_4$). A remaining portion of the sacrificial spacers, which includes a portion 818 on a first sidewall of the first trench and a portion 906 on sidewalls of second trench, is kept for air-gap formation purposes. In some embodiments, a mask 902 is applied to keep the second trench 514 with the second set of the sacrificial spacers 820 open for etching. Notably, an opening 904 of the mask 902 is wide relative to a horizontal dimension of the expecting air-gap, thus alignment requirements are decreased.

Figure 10A:
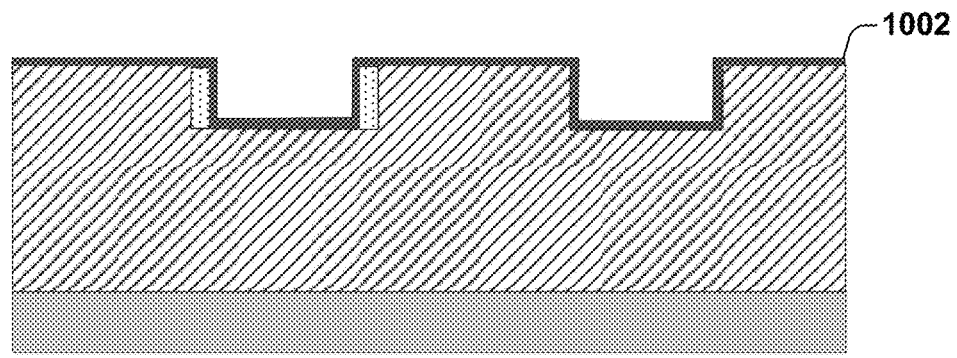
Figure 10B:
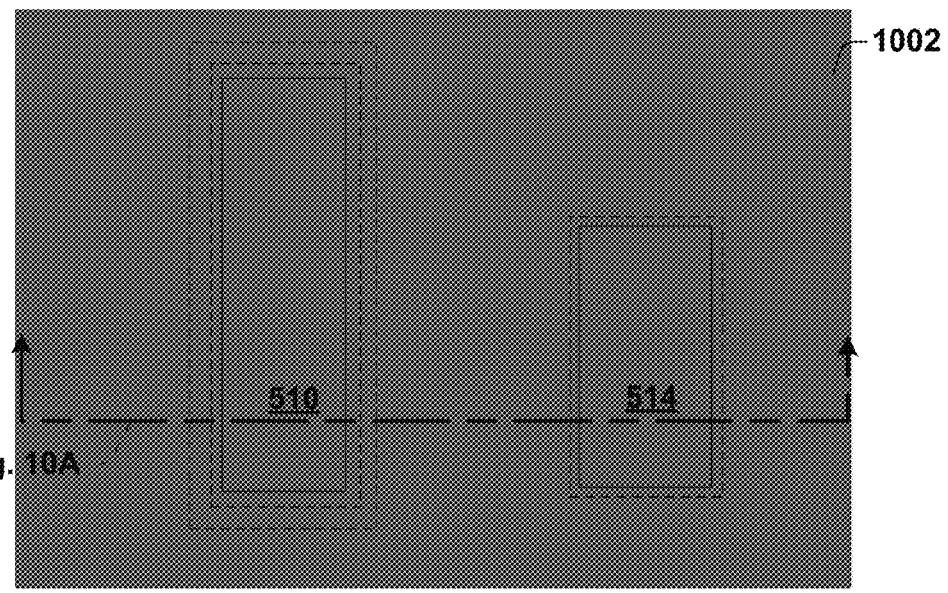

As shown in FIGS. 10a-10b, a first barrier layer 1002, for example, comprising Ta, TaN, Cobalt (Co) or their alloy is formed over the opening and the first low-k dielectric layer. The first barrier layer could be bilayer or multi-layer formed by more than one material.

Figure 11A:
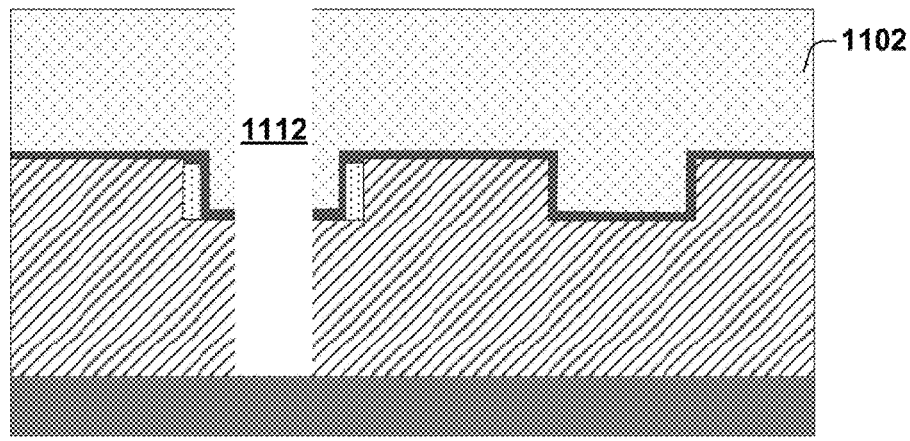
Figure 11B:
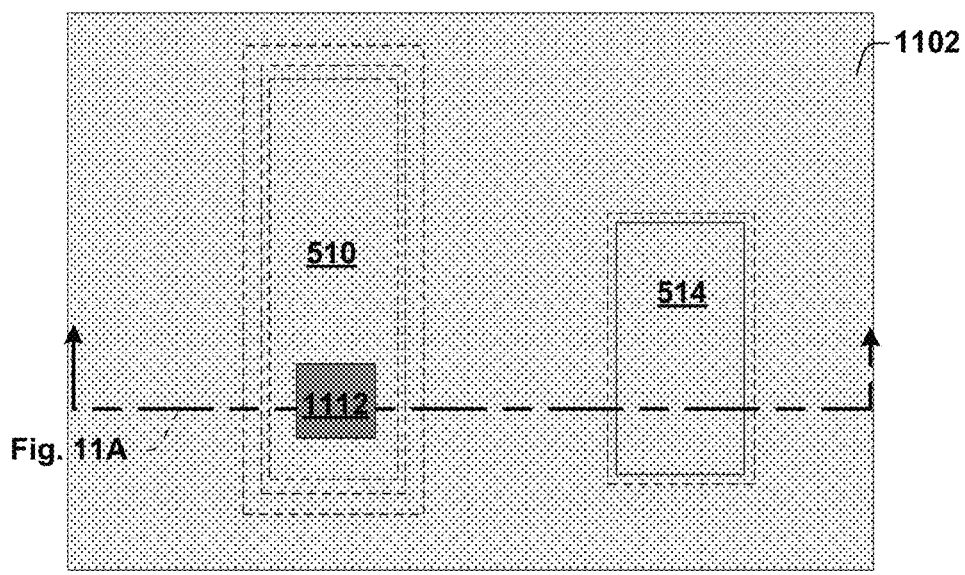

As shown in FIGS. 11a-11b, a first via 1112 under the first trench 510 is formed. The first via 1112 is connected to a first device or a first conductive layer under the first low-k dielectric layer 504.

Figure 12A:
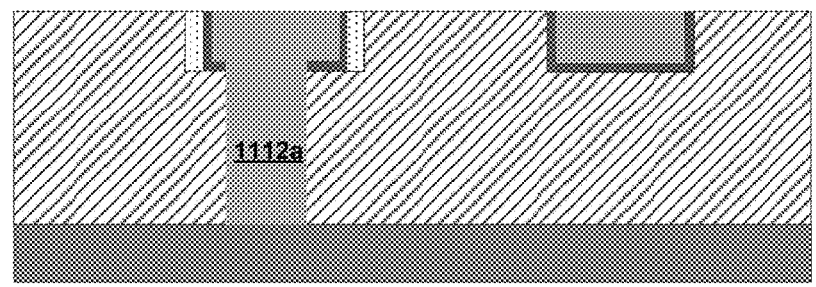
Figure 12B:
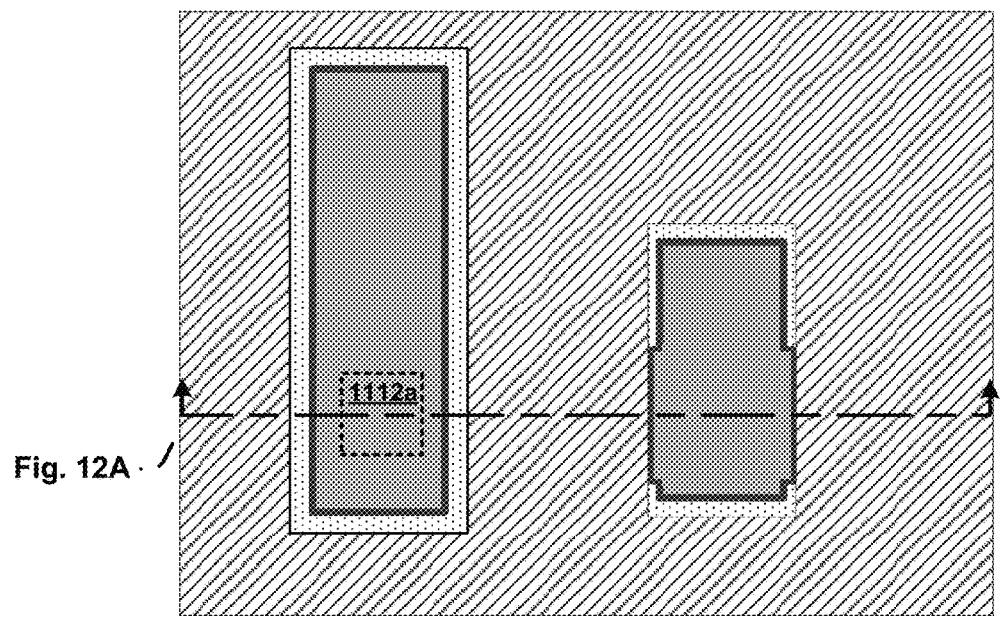

As shown in FIGS. 12a-12b, a conductive material, for example, copper, is filled to the openings to form via 1112a. A Chemical-Mechanical Polishing (CMP) process can be applied to smooth surfaces and remove a top part of the conductive material that is not needed.

Figure 13A:
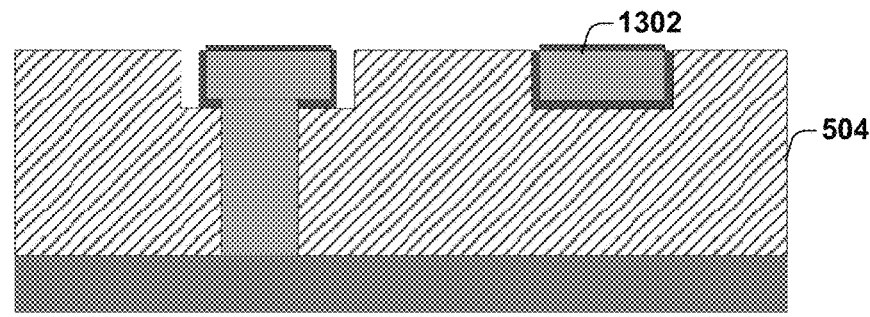
Figure 13B:
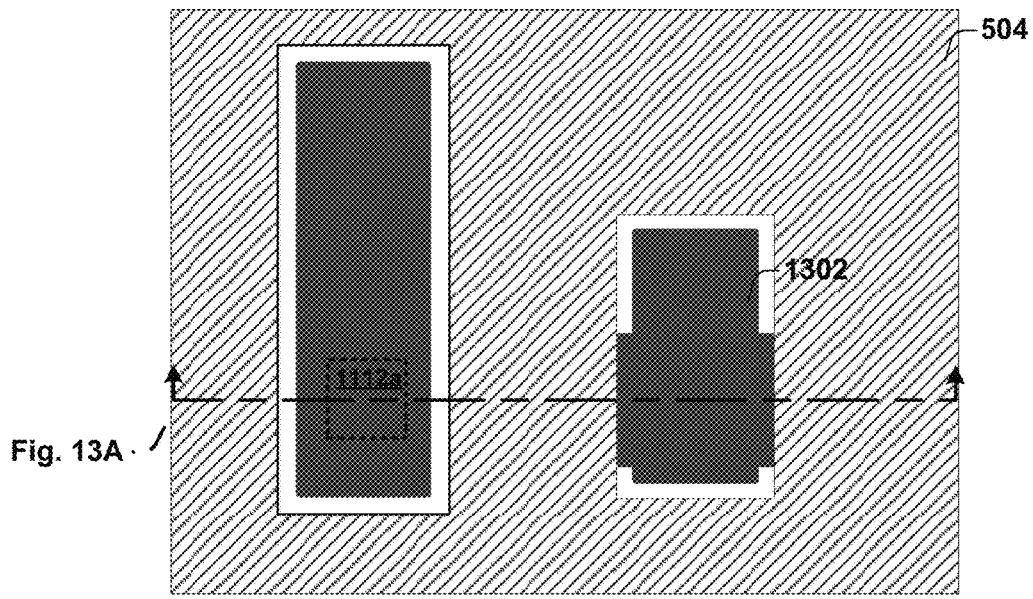

As shown in FIGS. 13a-13b, in some embodiments, a second barrier layer 1302, such as a Ta, TaN or Cobalt cap layer or a Co silicide material is formed to mitigate electromigration. In some embodiments, this second barrier layer 1302 can act as an etch stop layer (ESL) Then the remaining sacrificial spacer material is removed by a high selective etching process, for example, a wet etching at a temperature of between approximately 30° C. and approximately 70° C. A wet etchant may comprise $H_2O_2$ or $H_2SO_4$. An opening for the air-gap is opened at this step.

Figure 14A:
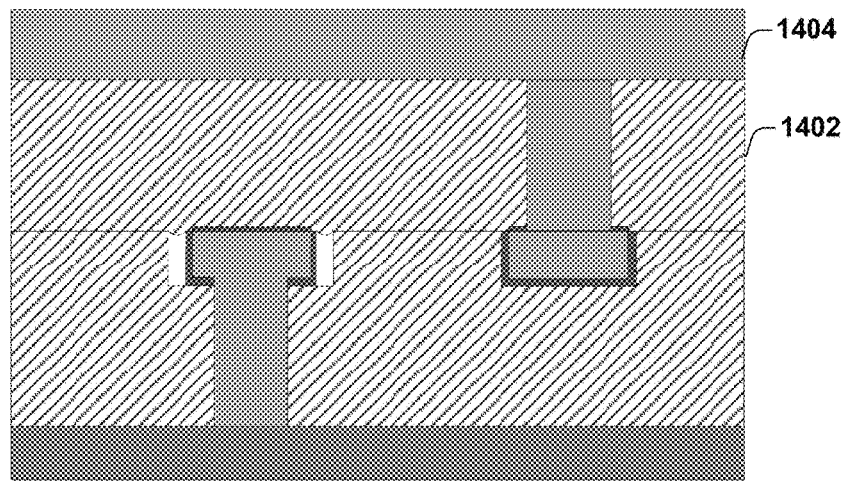
Figure 14B:
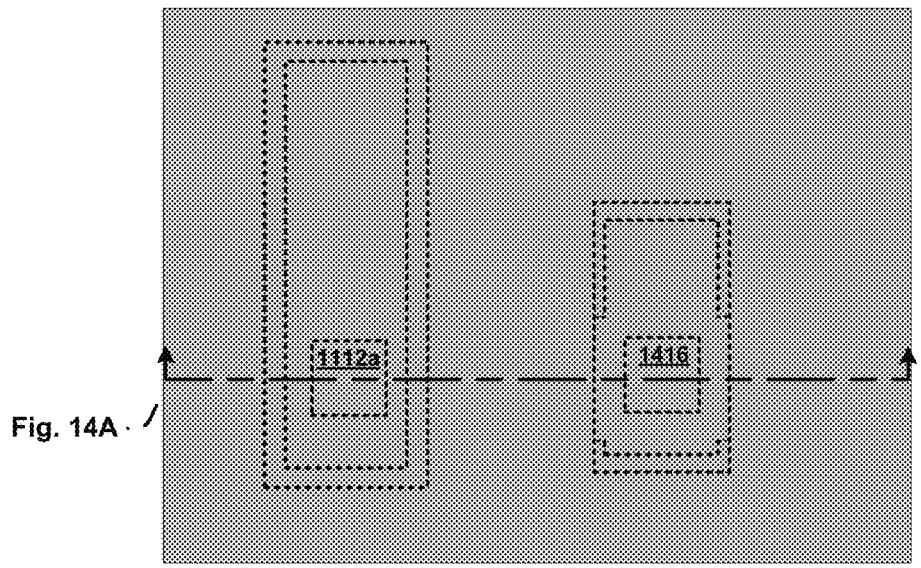

As shown in FIGS. 14a-14b, a second low-k dielectric layer 1402 is formed over the first low-k dielectric layer 504. It can be formed by spin-on process directly on the first low-k dielectric layer 504 and the air-gap 1406 is formed. In some alternative embodiments, the second low-k dielectric layer 1304 can be deposited after depositing another dielectric layer (not shown) with relative high k value by non-conformal CVD process. A second via 1416 in the second low-k dielectric layer 1402 is formed above the second trench. In some embodiments, the second via 1316 is connected to a second device (not shown) or a second conductive layer 1404 above the second low-k dielectric layer 1402. Since there is no air-gap on the sidewall of the second trench 514, there will be less damage to the first low-k dielectric layer 504 near the second trench 514 during a process to open the second low-k dielectric layer 1402 downward to the second trench 514 in the first low-k dielectric layer 504.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

In some embodiments, the present disclosure relates to an interconnect structure. The interconnect structure comprises a first conductive body arranged within a first dielectric layer over a substrate. A first air-gap separates sidewalls of the first conductive body from the first dielectric layer. A barrier layer is arranged on sidewalls of the first conductive body at a location between the first conductive body and the first air-gap. The first air-gap is defined by a first of the barrier layer and an opposing sidewall of the first dielectric layer.

In other embodiments, the present disclosure relates to an interconnect structure. The interconnect structure comprises a first dielectric layer arranged over a substrate and a first conductive structure arranged within the first dielectric layer. The first conductive structure includes a first section having a first width and a second section having a second width that is larger than the first width. A first air-gap is arranged between the first section and the first dielectric layer. The first air-gap has a third width that is substantially equal to one-half of a difference between the first width and the second width.

In yet other embodiments, the present disclosure relates to an interconnect structure. The interconnect structure comprises a first via arranged within a first dielectric layer disposed over a substrate, and a first conductive body arranged within the first dielectric layer over the first via. A first air-gap laterally separates sidewalls of the first conductive body from the first dielectric layer. A second dielectric layer is arranged over the first dielectric layer and comprises a curved lower surface that protrudes into the first air-gap. The curved lower surface has a bottommost point that is separated from sidewalls defining the first air-gap.

What is claimed is:

1. An interconnect structure, comprising:
   a first conductive body arranged within a first dielectric layer over a substrate;
   a first air-gap separating sidewalls of the first conductive body from the first dielectric layer;
   a barrier layer arranged on sidewalls of the first conductive body at a location between the first conductive body and the first air-gap and along a lower surface of the first conductive body facing the substrate;
   wherein the barrier layer continuously extends between the lower surface of the first conductive body and an upper surface of the first dielectric layer along a line perpendicular to the lower surface of the first conductive body; and
   wherein the first air-gap is defined by a sidewall of the barrier layer, an opposing sidewall of the first dielectric layer, and the upper surface of the first dielectric layer.

2. The interconnect structure of claim 1, wherein the barrier layer is further arranged along an upper surface of the first conductive body.

3. The interconnect structure of claim 1, wherein the barrier layer has a bottommost surface that is above the upper surface of the first dielectric layer.

4. The interconnect structure of claim 1, wherein the first air-gap continuously extends from a first side of the first conductive body to an opposing second side of the first conductive body.

5. The interconnect structure of claim 1, further comprising:
   a first via arranged within the first dielectric layer below the first conductive body;
   a second conductive body arranged within the first dielectric layer, wherein the first conductive body has first width over the first via and the second conductive body has a second width larger than the first width; and
   a second via arranged over the second conductive body and surrounded by a second dielectric layer arranged over the first dielectric layer.

6. The interconnect structure of claim 5, wherein the first conductive body laterally contacts the second conductive body.

7. The interconnect structure of claim 5, wherein the sidewall of the first dielectric layer extends in a substantially straight line along sides of the first air-gap and the second conductive body.

8. The interconnect structure of claim 5, wherein one or more sidewalls of the second conductive body are not separated from the first dielectric layer by an air-gap.

9. The interconnect structure of claim 5, wherein the second dielectric layer comprises a curved lower surface that protrudes into the first air-gap and that has a lowest point that is separated from the sidewalls of the barrier layer and the first dielectric layer that define the first air-gap.

10. An interconnect structure, comprising:
    a first dielectric layer arranged over a substrate;
    a first conductive structure arranged within the first dielectric layer and including a first section having a first width and a second section having a second width that is larger than the first width; and
    a first air-gap arranged between the first section and the first dielectric layer, wherein the first air-gap has a third width that is substantially equal to one-half of a difference between the first width and the second width.

11. The interconnect structure of claim 10, wherein the first conductive structure extends along a first two adjacent sides of the first air-gap and the first dielectric layer extends along a second two adjacent sides of the first air-gap.

12. The interconnect structure of claim 10, further comprising:
    a first via arranged below the first section and surrounded by the first dielectric layer; and
    a second via arranged over the second section and surrounded by a second dielectric layer over the first dielectric layer.

13. The interconnect structure of claim 12, further comprising:
    a barrier layer arranged on sidewalls and a lower surface of the first conductive structure, wherein the first via protrudes through an opening in the barrier layer.

14. The interconnect structure of claim 10, wherein the first air-gap continuously extends along from a first side of the first section to an opposing second side of the first section.

15. The interconnect structure of claim 10, further comprising:
    a barrier layer arranged on sidewalls of the first section at a location between the first section and the first air-gap.

16. An interconnect structure, comprising:
    a first via arranged within a first dielectric layer disposed over a substrate;
    a first conductive body arranged within the first dielectric layer over the first via;
    a first air-gap laterally separating sidewalls of the first conductive body from the first dielectric layer; and
    a second dielectric layer arranged over the first dielectric layer and including a curved lower surface that protrudes into the first air-gap, wherein the curved lower surface has a bottommost point that is separated from sidewalls defining the first air-gap.

17. The interconnect structure of claim 16, further comprising:
    a second conductive body arranged within the first dielectric layer, wherein the first conductive body has first width over the first via and the second conductive body has a second width larger than the first width; and
    a second via arranged over the second conductive body and surrounded by the second dielectric layer arranged over the first dielectric layer, wherein the second dielectric layer extends to an upper surface of the second via.

18. The interconnect structure of claim 16, further comprising:
    a barrier layer arranged on sidewalls of the first conductive body at a location between the first conductive body and the first air-gap.

19. The interconnect structure of claim 18, wherein the first via protrudes through an opening in the barrier layer.

20. The interconnect structure of claim 18, wherein the barrier layer has a bottommost surface over a bottommost surface of the first via.

\* \* \* \* \*